(12) United States Patent
Babcock

(10) Patent No.: US 6,475,811 B1
(45) Date of Patent: Nov. 5, 2002

(54) SYSTEM FOR AND METHOD OF USING BACTERIA TO AID IN CONTACT HOLE PRINTING

(75) Inventor: Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 47 days.

(21) Appl. No.: 09/844,213

(22) Filed: Apr. 27, 2001

(51) Int. Cl.[7] .............................................. H01L 21/00

(52) U.S. Cl. ............................ 438/1; 438/99; 438/424; 438/700; 438/725; 438/800

(58) Field of Search ............................. 438/1, 99, 424, 438/700, 725, 800; 257/520, 40, 798

(56) References Cited

U.S. PATENT DOCUMENTS ks6,329,289 B1 * 12/2001 Kimura ........................ 438/1

* cited by examiner

Primary Examiner—Richard Elms
Assistant Examiner—Douglas Menz
(74) Attorney, Agent, or Firm—Foley & Lardner

(57) ABSTRACT

An exemplary method of forming a contact hole having a critical dimension which is smaller than one minimum lithographic feature can include providing a photoresist layer over a layer of material in which a contact hole is to be formed, etching the photoresist layer with an aperture having a first critical dimension, providing a bacteria film on the surface of the layer of photoresist which includes lateral side walls of the aperture, and etching a contact hole in the layer of material. The bacteria film decreases the aperture in width to a second critical dimension. The contact hole has the second critical dimension.

20 Claims, 1 Drawing Sheet

SYSTEM FOR AND METHOD OF USING BACTERIA TO AID IN CONTACT HOLE PRINTING

FIELD OF THE INVENTION

The present specification relates generally to fabrication processes for integrated circuits. More specifically, the present specification relates to a system for and a method of using bacteria to aid in contact hole printing.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite,the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. In general, projection lithography refers to processes for pattern transfer between various media. According to conventional projection lithography a silicon slice, the wafer, is coated uniformly with a radiation-sensitive film or coating, the photoresist. An exposing source of radiation (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive image of the subject pattern.

Exposure of the coating through a photomask or reticle causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation.

One alternative to projection lithography is EUV lithography. EUV lithography reduces feature size of circuit elements by lithographically imaging them with radiation of a shorter wavelength. "Long" or "soft" x-rays (a.k.a, extreme ultraviolet (EUV)), wavelength range of lambda=50 to 700 angstroms are used in an effort to achieve smaller desired feature sizes.

In EUV lithography, EUV radiation can be projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle.

Both conventional projection and EUV lithographic processes are limited in their ability to print small features, such as, contacts, trenches, polysilicon lines or gate structures. As such, the critical dimensions of IC device features, and, thus, IC devices, are limited in how small they can be.

Thus, there is a need to pattern IC devices using non-conventional lithographic techniques. Further, there is a need to form smaller feature sizes, such as, contact holes. Yet further, there is a need to use bacteria to aid in contact hole printing.

The teachings here and below extend to those embodiments which fall within the scope of the appended claims, regardless of whether they accomplish one or more of the above-mentioned needs.

SUMMARY OF THE INVENTION

An exemplary embodiment is related to a method of forming a contact hole having a critical dimension which is smaller than one minimum lithographic feature. This method can include providing a photoresist layer over a layer of material in which a contact hole is to be formed, etching the photoresist layer with an aperture having a first critical dimension, providing a bacteria film on the surface of the layer of photoresist which includes lateral side walls of the aperture, and etching a contact hole in the layer of material. The bacteria film decreases the aperture in width to a second critical dimension. The contact hole has the second critical dimension.

Another exemplary embodiment is related to a method of manufacturing an integrated circuit. This method can include patterning a standard feature size on a photoresist layer disposed over a substrate layer, providing for bacteria growth on the patterned photoresist layer where the bacteria growth forms a layer of bacteria along the top surface of the photoresist layer and side walls of the patterned features, and etching an aperture in the substrate layer according to the pattern defined by the pattern photoresist layer and the provided bacteria layer. The aperture has a critical dimension less than the standard feature size patterned on the photoresist layer.

Another embodiment is related to an integrated circuit having trench lines. The integrated circuit is manufactured by a method which can include patterning a standard feature size on a photoresist layer disposed over a substrate layer, providing for bacteria growth on the patterned photoresist layer where the bacteria growth forms a layer of bacteria along the top surface of the photoresist layer and side walls of the patterned features, and etching an aperture in the substrate layer according to the pattern defined by the pattern photoresist layer and the provided bacteria layer. The aperture has a critical dimension less than the standard feature size patterned on the photoresist layer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, an.

DETAILED DESCRIPTION OF EXEMPLARY EMBODIMENTS

Figure 1:
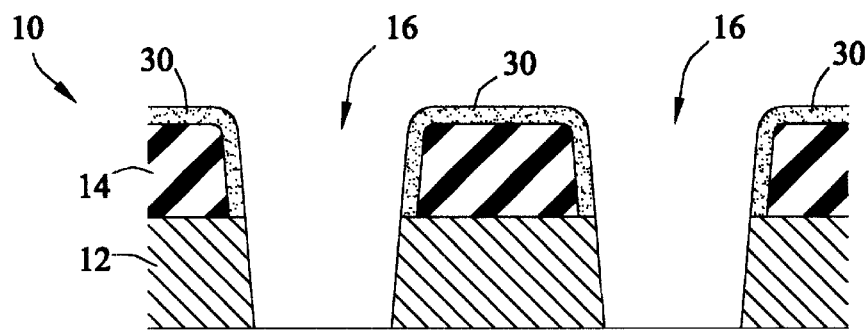
FIG. 1 is a cross-sectional view of a portion of an integrated circuit fabricated in accordance with an exemplary embodiment.

Referring to FIG. 1, a cross-sectional view of a portion 10 of an integrated circuit (IC) includes an oxide layer 12, a photoresist layer 14, and apertures or holes 16. Portion 10 is preferably part of an ultra-large-scale integrated (ULSI) circuit having millions or more transistors. Portion 10 is manufactured as part of the IC on a semiconductor wafer, such as, a silicon wafer.

In an exemplary embodiment, oxide layer 12 is an oxide, tetraethyl orthosilicate (TEOS) deposited silicon dioxide, or any other suitable material. Photoresist layer 14 is any of a variety of materials which provide photoresistant characteristics and can be configured for use in lithographic processes. Apertures 16 can be used to print contact holes or trench lines in oxide layer 12. In an exemplary embodiment, apertures 16 have a critical dimension or width of 150–400 nm, which is smaller than apertures of 600–800 nm formed by conventional steppers. During integrated circuit fabrication processes, contact holes are filled with a conductive material to form an electrical contact. Similarly, apertures 16 can be used for trench lines in which they are filled with silicon dioxide deposited in, for example, a tetraethyl orthosilicate (TEOS) process or filled with some other electrically insulative material. In an exemplary embodiment, trench lines are used to provide electrical isolation between devices fabricated on the same piece of silicon.

Advantageously, apertures 16 have a critical dimension which reduces the size possible when using conventional inexpensive steppers. In one embodiment, the critical dimension of apertures 16 is 150–400 nm in width. Indeed, using the technique described herein, apertures 16 can be formed to have a critical dimension smaller than 300 nm in width.

Figure 2:
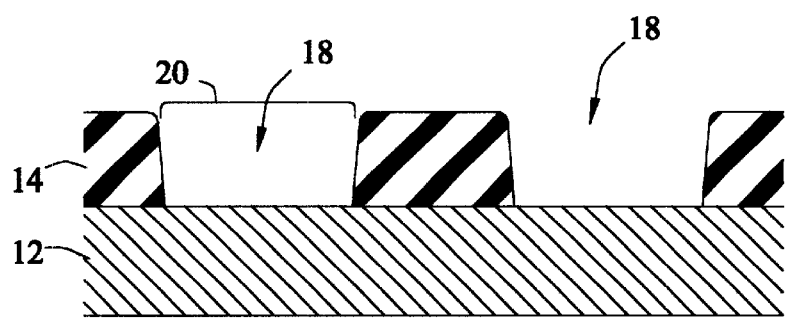
FIG. 2 is a cross-sectional view of a portion of an integrated circuit, showing a photoresist deposition and patterning step in an exemplary method of manufacturing the integrated circuit illustrated in FIG. 1.

An exemplary method of forming portion 10 is described below with reference to FIGS. 1–4. This method advantageously forms portion 10 having contact holes or trench lines with small critical dimensions. In FIG. 2, a cross-sectional view of portion 10 illustrates the deposition and patterning of photoresist layer 14. In an exemplary embodiment, photoresist layer 14 is formed by depositing a photoresist material and printing, patterning, or removing of portions of the photoresist material to form apertures or holes 18. In an exemplary embodiment, apertures 18 are printed in photoresist layer 14 using optical lithography. Apertures 18 have a critical dimension 20 which is one minimum lithographic feature. In an exemplary embodiment, critical dimension 20 is 600–800 nm.

Figure 3:
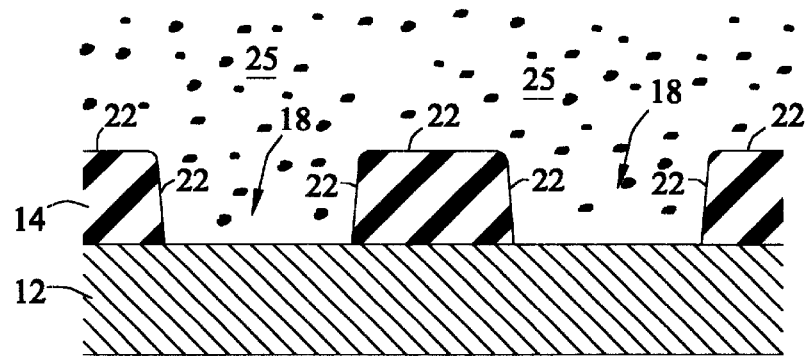
FIG. 3 is a cross-sectional view of a portion of an integrated circuit, showing a bacteria provision step in an exemplary method of manufacturing the integrated circuit illustrated in FIG. 1.

In FIG. 3, a cross-sectional view of portion 10 illustrates deposition of bacteria 25 or bacteria growth on surface 22 of photoresist layer 14. In an exemplary embodiment, bacteria 25 can be actinomyces viscosus, streptococcus mutans, and streptococcus sanguis. Bacteria 25 can have the attributes of being capable of spontaneously forming films by adhering to each other and to a substrate. In an exemplary embodiment, a solution containing live bacteria 25, such as, genetically engineered bacteria is used to treat portion 10 patterned with holes 18. In an exemplary embodiment, bacteria 25 can be cultured on surface 22 of photoresist layer 14 by the use of an additive which is a nutrient for bacteria 25. Alternatively, bacteria 25 can be chosen as a type of bacteria with the ability to grow on photoresist layer 14 but not on oxide layer 12 (e.g., silicon dioxide, silicon nitride). Bacteria 25 forms colonies and/or deposit plaques on photoresist layer 14, increasing the thickness of photoresist layer 14 and thus reducing the size of aperture 18. Bacteria 25 can be any class of microscopic plant. A variety of different temperatures may be used depending on the type of bacteria to be grown. In an exemplary embodiment, a temperature of 35–37° C. is used to grow the aforementioned types of bacteria.

In an exemplary embodiment, portion 10 is immersed in an aqueous bath including a culture of live bacteria, albumin, sugars, pH buffers, enzymes, and various types of proteins. Such an aqueous bath can provide for the deposition of bacteria 25 on surface 22.

In an alternative embodiment, a thin coating of a substance may be deposited on exposed surface 24 of oxide layer 12 but where the substance repels bacteria 25 from growing or forming plaques on oxide layer 12. Such a substance would not inhibit bacteria growth on surface 22 of photoresist layer 14. In an exemplary embodiment, such a substance can be calcium fluoride.

Figure 4:
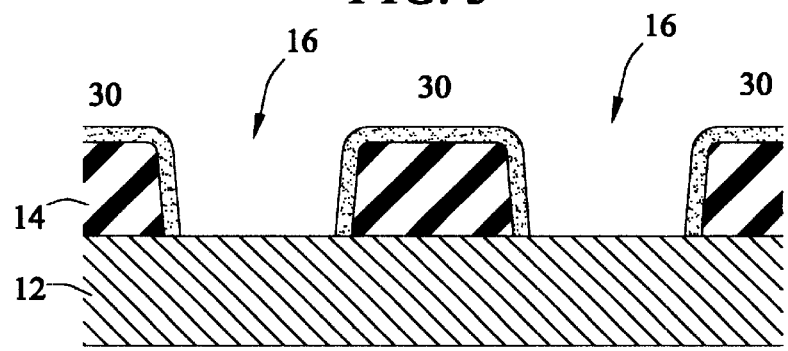
FIG. 4 is a cross-sectional view of a portion of an integrated circuit, showing a bacterial film deposed over the layer of photoresist in accordance with an exemplary embodiment.

In FIG. 4, the wafer of portion 10 is rinsed and dried and bacteria layer 30 and photoresist layer 14 are used during an etching process to determine the size of aperture 16 in oxide layer 12. In an exemplary embodiment, bacteria layer 30 or bacterial film has a thickness of 200–500 nm. Advantageously, bacteria layer 30 reduces the size of aperture 18, thereby reducing the critical dimension of aperture 16 in oxide layer 12. In an exemplary embodiment, aperture 18 is reduced in width from 600–800 nm to 150–400 nm. Bacteria layer 30 has a thickness which can be selectively changed depending on the amount of bacteria 25 provided. Further, the method described with reference to FIGS. 1–4 avoids feature size limitations inherent to conventional lithography.

While the embodiments illustrated in the FIGURES and described above are presently preferred, it should be understood that these embodiments are offered by way of example only. Other embodiments may include, for example, different methods of providing bacteria as well as different features to be patterned using bacteria 25. The invention is not limited to a particular embodiment but extends to various modifications, combinations, and permutations that nevertheless fall within the scope and spirit of the appended claims.

What is claimed is:

1. A method of forming a contact hole having a critical dimension which is smaller than one minimum lithographic feature, the method comprising:

provinding a photoresist layer over a layer of material in which a contact hole is to be formed;

etching the photoresist layer with an aperture having a first critical dimension;

providing a bacteria film on the surface of the layer of photoresist, including lateral side walls of the aperture, the bacteria film decreasing the aperture in width to a second critical dimension; and etching a contact hole in the layer of material, the contact hole having the second critical dimension.

2. The method of claim 1, wherein the step of providing a bacterial film comprises immersing the surface of the layer of photoresist in an aqueous solution including a culture of live bacteria.

3. The method of claim 1, further comprising providing an additive to the surface of the layer of photoresist, the additive having a characteristic which facilitates growth of bacteria thereon.

4. The method of claim 1, further comprising depositing a substance on exposed portions of the layer of material, the substance having a characteristic which inhibits bacteria growth or formation.

5. The method of claim 1, wherein the first critical dimension is 600–800 nm.

6. The method of claim 1, wherein the second critical dimension is 150–400 nm.

7. The method of claim 1, wherein the bacteria film has a thickness of 200–500 nm.

8. The method of claim 1, wherein the bacteria film comprises an actinomyces viscosus bacteria.

9. A method of manufacturing an integrated circuit comprising:

patterning a standard feature size on a photoresist layer disposed over a substrate layer;

providing for bacteria growth on the patterned photoresist layer, the bacteria growth forming a layer of bacteria along the top surface of the photoresist layer and side walls of the patterned features; and etching an aperture in the substrate layer according to the pattern defined by the pattern photoresist layer and the provided bacteria layer, the aperture having a critical dimension less than the standard feature size patterned on the photoresist layer.

10. The method of claim 9, further comprising providing a bacteria solution.

11. The method of claim 9, wherein the standard feature size pattern in the photoresist layer is 180 nm.

12. The method of claim 9, wherein the critical dimension of the aperture in the substrate is 150–400 nm.

13. The method of claim 9, further comprising depositing a bacterial facilitator on the surface of the patterned photoresist layer.

14. The method of claim 9, further comprising depositing a bacterial inhibitor on exposed portions of the substrate layer.

15. An integrated circuit having trench lines, the integrated circuit manufactured by a method comprising:

patterning a standard feature size on a photoresist layer disposed over a substrate layer;

providing for bacteria growth on the patterned photoresist layer, the bacteria growth forming a layer of bacteria along the top surface of the photoresist layer and side walls of the patterned features; and etching an aperture in the substrate layer according to the pattern defined by the pattern photoresist layer and the provided bacteria layer, the aperture having a critical dimension less than the standard feature size patterned on the photoresist layer.

16. The integrated circuit manufactured by the method of claim 15, further comprising providing an additive to the surface of the patterned photoresist layer, the additive facilitating bacterial growth.

17. The integrated circuit manufactured by the method of claim 15, wherein the bacterial film has a width of 200–500 nm.

18. The integrated circuit manufactured by the method of claim 15, further providing depositing a thin coating of a substance on the substrate layer, the substance repelling bacteria from growing or forming on the substrate layer.

19. The integrated circuit manufactured by the method of claim 15, wherein the aperture of the substrate layer has a critical dimension of 150–400 nm.

20. The integrated circuit manufactured by the method of claim 15, further comprising depositing bacteria by immersing the patterned photoresist layer in an aqueous solution including a culture of live bacteria.

* * * * *